United States Patent
Lauer et al.

(10) Patent No.: US 7,330,520 B2
(45) Date of Patent: Feb. 12, 2008

(54) REDUCED SIZE AND POWER DEMAPPER FOR VITERBI DECODING

(75) Inventors: Joseph Paul Lauer, Mountain View, CA (US); Alan Corry, Santa Clara, CA (US)

(73) Assignee: Broadcom Corporation, Irvine, CA (US)

( * ) Notice: Subject to any disclaimer, the term of this patent is extended or adjusted under 35 U.S.C. 154(b) by 705 days.

(21) Appl. No.: 10/810,307

(22) Filed: Mar. 26, 2004

(65) Prior Publication Data

US 2005/0213690 A1    Sep. 29, 2005

(51) Int. Cl.
*H04L 27/06* (2006.01)
(52) U.S. Cl. ...................................... 375/341
(58) Field of Classification Search ................ 375/341, 375/262, 264, 265; 714/792, 795, 796
See application file for complete search history.

(56) References Cited

U.S. PATENT DOCUMENTS

| | | | | |
|---|---|---|---|---|
| 5,757,844 A | * | 5/1998 | Fukawa et al. | ............. 375/136 |
| 5,841,796 A | * | 11/1998 | Snyder, Jr. | .................. 714/794 |
| 5,844,946 A | * | 12/1998 | Nagayasu | .................... 375/341 |
| 2004/0078408 A1 | * | 4/2004 | Miller et al. | ................. 708/492 |
| 2004/0136467 A1 | * | 7/2004 | Nodoa | ......................... 375/286 |

* cited by examiner

*Primary Examiner*—Chieh M. Fan
*Assistant Examiner*—Jaison Joseph
(74) *Attorney, Agent, or Firm*—Garlick Harrison & Markison; Bruce E. Garlick

(57) ABSTRACT

A Viterbi decoding demapping scheme for a wireless communications device processor substantially implemented on a single CMOS integrated circuit is described. By using log and antilog techniques, simplified multiplication and division operations in the branch metric calculation may be performed. A fully integrated receiver circuit with Viterbi decoder with branch metric computation consumes less circuit space and power than conventional solutions.

16 Claims, 5 Drawing Sheets

REDUCED SIZE AND POWER DEMAPPER FOR VITERBI DECODING

BACKGROUND OF THE INVENTION

1. Field of the Invention

The present invention is directed in general to communications systems. In one aspect, the present invention relates to a method and system for performing Viterbi decoding on a transmitted signal.

2. Related Art

Communication systems are known to support wireless and wire-lined communications between wireless and/or wire-lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth (BT), advanced mobile phone services (AMPS), digital AMPS, global system for mobile communications (GSM), code division multiple access (CDMA), local multi-point distribution systems (LMDS), multi-channel-multi-point distribution systems (MMDS) and/or variations thereof.

Depending on the type of wireless communication system, a wireless communication device (such as a cellular telephone, two-way radio, personal digital assistant (PDA), personal computer (PC), laptop computer, home entertainment equipment, etc.) communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over the tuned channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switched telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). The transmitter typically includes a data modulation stage, one or more intermediate frequency stages and a power amplifier. The data modulation stage converts raw data into baseband signals in accordance with a particular wireless communication standard. The intermediate frequency stages mix the baseband signals with one or more local oscillations to produce RF signals. The power amplifier amplifies the RF signals prior to transmission via an antenna. In direct conversion transmitters/receivers, conversion directly between baseband signals and RF signals is performed.

The receiver is typically coupled to an antenna and includes a low noise amplifier, one or more intermediate frequency stages, a filtering stage and a data recovery stage. The low noise amplifier receives inbound RF signals via the antenna and amplifies them. The intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

A variety of wireless communication standards may be used with the exemplary communication systems described herein, including Bluetooth, IEEE 802.11 (a), (b), (g) and others. In addition, wire-based communication may also be used. In any case, a typical communication system 10 is shown in FIG. 1, where a signal from the source 2 will be converted to digital form (u) by using a source encoder, formatter or other techniques for digitizing information. The encoder 4 adds redundancy to the data bits to protect against errors. The resulting encoded data (c) is modulated by a modulator 6 and transmitted through the channel. During transmission, it is very likely that the transmitted data is altered by noise from the channel. Therefore, on the receiver side, it is likely that the received data 15 is not the same as the transmitted data 3. To address this, the decoder 14 reconstructs the transmitted data based on the received symbols 15, typically by using a Viterbi decoder 14 to detect convolutional Forward Error Correction (FEC) encoded data, which is the coding used for channels with Additive White Gaussian Noise (AWGN).

Viterbi decoding is commonly used as a technique for recovering the most likely sequence of information bits that have been encoded with convolutional coding and degraded by transmission through a communication channel. A Viterbi decoder uses a trellis diagram representation of the convolutional code to model the code as a set of states and branches. At a time n, the code occupies state $S_n$. The branches of the trellis diagram denote allowable transitions between states. In Viterbi decoding, a metric is associated with each state and each transition between states (branch). The metric reflects the likelihood of the code occupying that state at that time instant, given the received bits. In general, a higher metric value implies that a state is less likely at that time instant, although lower values for less likely states equivalently may be used. Using the state metric at time n-1, the metric for each possible next state at time n is computed by the three step Viterbi algorithm. In the three step Viterbi algorithm, the path metrics (which represent the likelihood of entering a state from an allowable path) are added. The path metrics for various paths are compared and the lowest metric is then selected as the most probable path. Using this add/compare/select algorithm, a Viterbi decoder can determine the most likely sequence of information bits by tracing the sequence of branches, having the maximum likelihood, leading to a particular state.

As shown in FIG. 1, the demapper 12 converts the channel output (y) into an input (M) to the Viterbi decoder. This input (M) is a sequence of values called Viterbi branch metrics that reflects the likelihood of receiving the channel output, given a possible sequence of encoded bits. Prior implementations of soft decision Viterbi branch metric computation have used high accuracy multiplication operations to compute the branch metrics, requiring large numbers of gates and pipeline stages and consuming significant area and power. Viterbi decoding, while simpler than iterative forms of decoding such as MAP (Maximum A Posteriori) or soft Viterbi decoding, in general does not perform as well.

In addition to the complexity of the computational requirements for a communications transceiver, such as described above, the ever-increasing need for higher speed communications systems imposes additional performance requirements and resulting costs for communications systems. In order to reduce costs, communications systems are increasingly implemented using Very Large Scale Integration (VLSI) techniques. The level of integration of communications systems is constantly increasing to take advantage of advances in integrated circuit manufacturing technology and the resulting cost reductions. This means that communications systems of higher and higher complexity are being implemented in a smaller and smaller number of integrated circuits. For reasons of cost and density of integration, the preferred technology is CMOS. To this end, digital signal processing ("DSP") techniques generally allow higher levels of complexity and easier scaling to finer geometry technologies than analog techniques, as well as superior testability and manufacturability.

Therefore, there is a need in the art for improved Viterbi decoding which is less complex than the iterative forms of decoding. In addition, as both power and area are at a premium in semiconductor design, it is advantageous to reduce the area and power required for Viterbi branch metric computation without sacrificing decoding performance. Therefore, a need exists for methods and/or apparatuses for improving the design and operation of decoding processes, and to do so in a way that reduces circuit complexity, circuit size and power consumption. Further limitations and disadvantages of conventional systems will become apparent to one of skill in the art after reviewing the remainder of the present application with reference to the drawings and detailed description which follow.

SUMMARY OF THE INVENTION

Broadly speaking, the present invention provides a novel method and system for computing soft-decision Viterbi branch metrics that is both power and area efficient. Using a simplified expression for the metrics, log domain calculations, and efficient log and antilog functions, the branch metric computation of the present invention may be used in wireless communication devices, such as 802.11 a/b/g wireless LAN transceivers.

In accordance with various embodiments of the present invention, a method and apparatus provides a Viterbi decoding technique that may be used in an integrated circuit wireless communication device that receives a transmitted signal over a channel that is characterized by a scalar gain value and a noise value. These values are processed to determine a branch metric by using log and antilog processes such that complex multiplication operations are replaced with simple addition operations. In a selected embodiment, a processor computes a simplified expression for determining Viterbi branch metrics by taking the log of a the scalar gain value and subtracting therefrom a log of the noise value and subtracting therefrom the log of a first constant to form a first sum, and determining an antilog of the first sum and subtracting therefrom a second constant to form a second sum, the second sum corresponding to the branch metric. The branch metric may then be provided to a Viterbi decoder. Additional computational factors (such as a location information scaling factor) and processing (such as rounding out any fractional bits in the second sum and/or saturating the second sum) may be included in the computation of the branch metrics. Lookup table interpolation techniques are used to implement the log function of a value with reduced power and circuit size by concatenating two terms—(1) a lower integer boundary L for the value which is the bit position of the most significant "1" in a binary representation of the value, and (2) an interpolated value between L and L+1 using a lookup table indexed by the P next most significant bits of the value—to form the log of the value. The antilog of a value may also be efficiently implemented with lookup table techniques by right shifting the value by R bits to generate a left shift control signal, and then using the R least significant bits of the value as an index into a lookup table to generate an intermediate value which is left shifted under control of the left shift control signal to generate the antilog of the value. In selected embodiments, the processing of the gain value and noise value are performed by a PHY module in a wireless interface device.

The objects, advantages and other novel features of the present invention will be apparent from the following detailed description when read in conjunction with the appended claims and attached drawings.

DETAILED DESCRIPTION

A method and apparatus for an improved Viterbi decoding system is described. While various details are set forth in the following description, it will be appreciated that the present invention may be practiced without these specific details. For example, selected aspects are shown in block diagram form, rather than in detail, in order to avoid obscuring the present invention. Some portions of the detailed descriptions provided herein are presented in terms of algorithms or operations on data within a computer memory. Such descriptions and representations are used by those skilled in the data processing arts to describe and convey the substance of their work to others skilled in the art. In general, an algorithm refers to a self-consistent sequence of steps leading to a desired result, where a "step" refers to a manipulation of physical quantities which may, though need not necessarily, take the form of electrical or magnetic signals capable of being stored, transferred, combined, compared, and otherwise manipulated. It is common usage to refer to these signals as bits, values, elements, symbols, characters, terms, numbers, or the like. These and similar terms may be associated with the appropriate physical quantities and are merely convenient labels applied to these quantities. Unless specifically stated otherwise as apparent from the following discussion, it is appreciated that throughout the description, discussions using terms such as processing, computing, calculating, determining, displaying or the like, refer to the action and processes of a computer system, or similar electronic computing device, that manipulates and/or transforms data represented as physical, electronic and/or magnetic quantities within the computer system's registers and memories into other data similarly represented as physical quantities within the computer system memories or registers or other such information storage, transmission or display devices.

Figure 1:
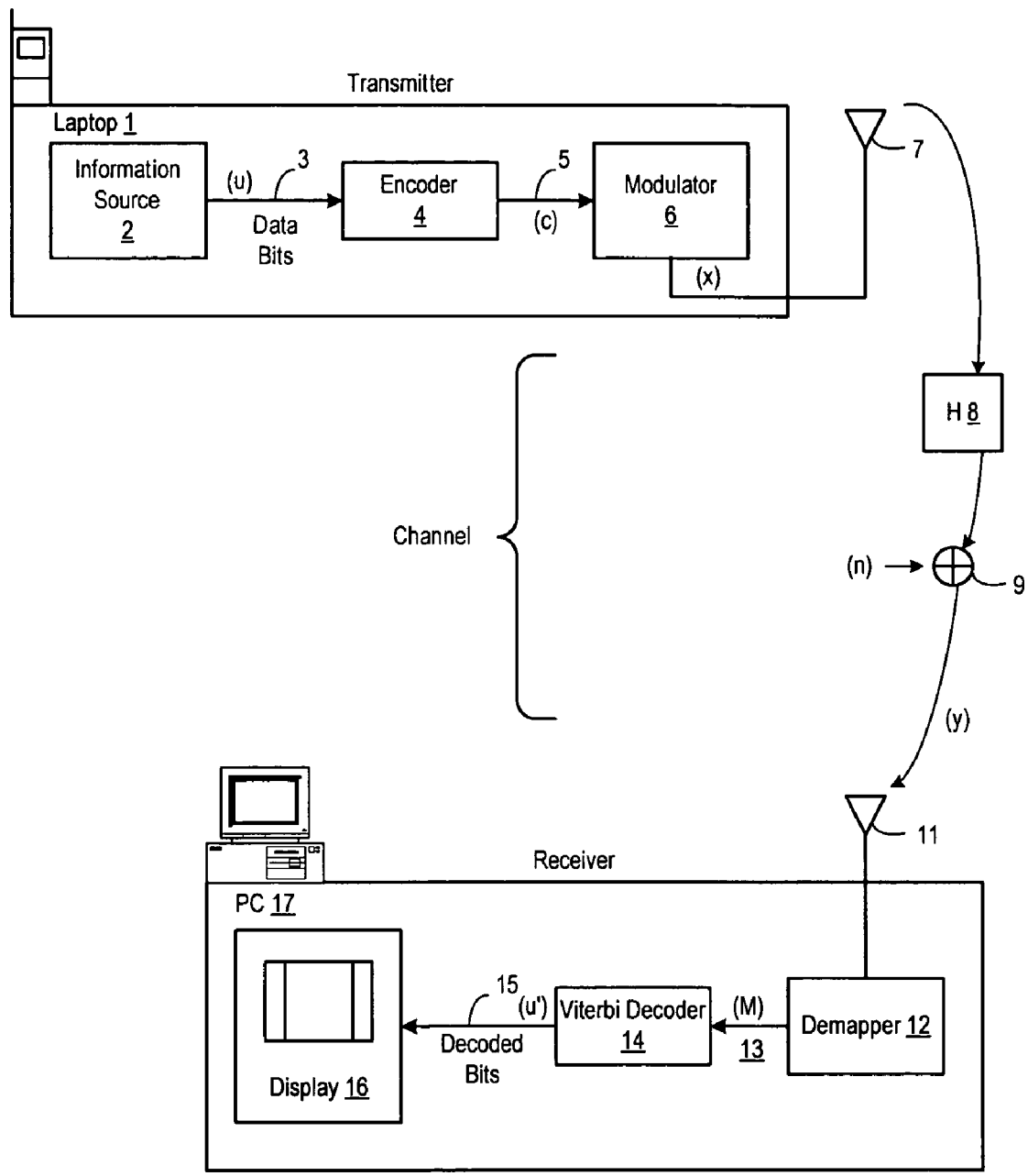
FIG. 1 is a schematic block diagram of a communication system in accordance with the present invention.

FIG. 1 illustrates a data communication system 10 in which embodiments of the present invention may operate. For example, data communication system 10 may be implemented as a data transmission system. As illustrated, data is provided to the transmission system by an information source 2. For purposes of illustration, the information source 2 may be considered to be a PC, which provides video data (u) to end users. Embodiments of the invention, however, are not limited to any particular type of information source and any other data source could be equivalently substituted. The data (u) provided by information source 2 may comprise analog or digital signals such as (but not limited to) video signals, audio signals and/or data signals, and may be formatted in appropriate form. The data (u) is then provided to an encoder 4 for encoding. In selected embodiments of the present invention, the encoder 4 encodes the data (u) to improve performance over the channel.

Encoder 4 provides encoded data to a modulator 6 which generates modulated data (x). The transmitter transmits the encoded data provided by modulator 6, for example, using an antenna 7. The signal is transmitted from antenna 7 through a channel to a receiving antenna 11. The channel can be modeled as a block, H 8, which distorts the magnitude and phase of the signal transmitted by the antenna 7, followed by a noise 9 which is added to the output of H 8 to further alter the signal. Antenna 11 collects the signal (y) and provides the collected signal to a receiver. The receiver amplifies and demodulates/detects the signal as appropriate and provides the detected signal to a decoder 14.

Decoder 14 will, essentially, reverse the process of the encoder 4 and recreate the data (u'), which should represent a good estimate of the data (u) that had been broadcast. The decoder 14 may use Forward Error Correction (FEC) techniques to correct errors in the received signal. The data (u') provided by the decoder 14 may be formatted or otherwise prepared for use by an information sink, such as the display system 16.

Although FIG. 1 illustrates a communication system 10 where data is being transmitted between a laptop computer transmitter and a PC computer receiver, it will be appreciated that the present invention may be applied in connection with communications between and among base stations, access points, wireless communication devices (such as laptop computers, personal digital assistants, personal computers and/or cellular telephones) and other network hardware elements. The details of an example wireless communication device will be described in greater detail with reference to FIGS. 2-7.

Regardless of the particular type of communication system, each communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
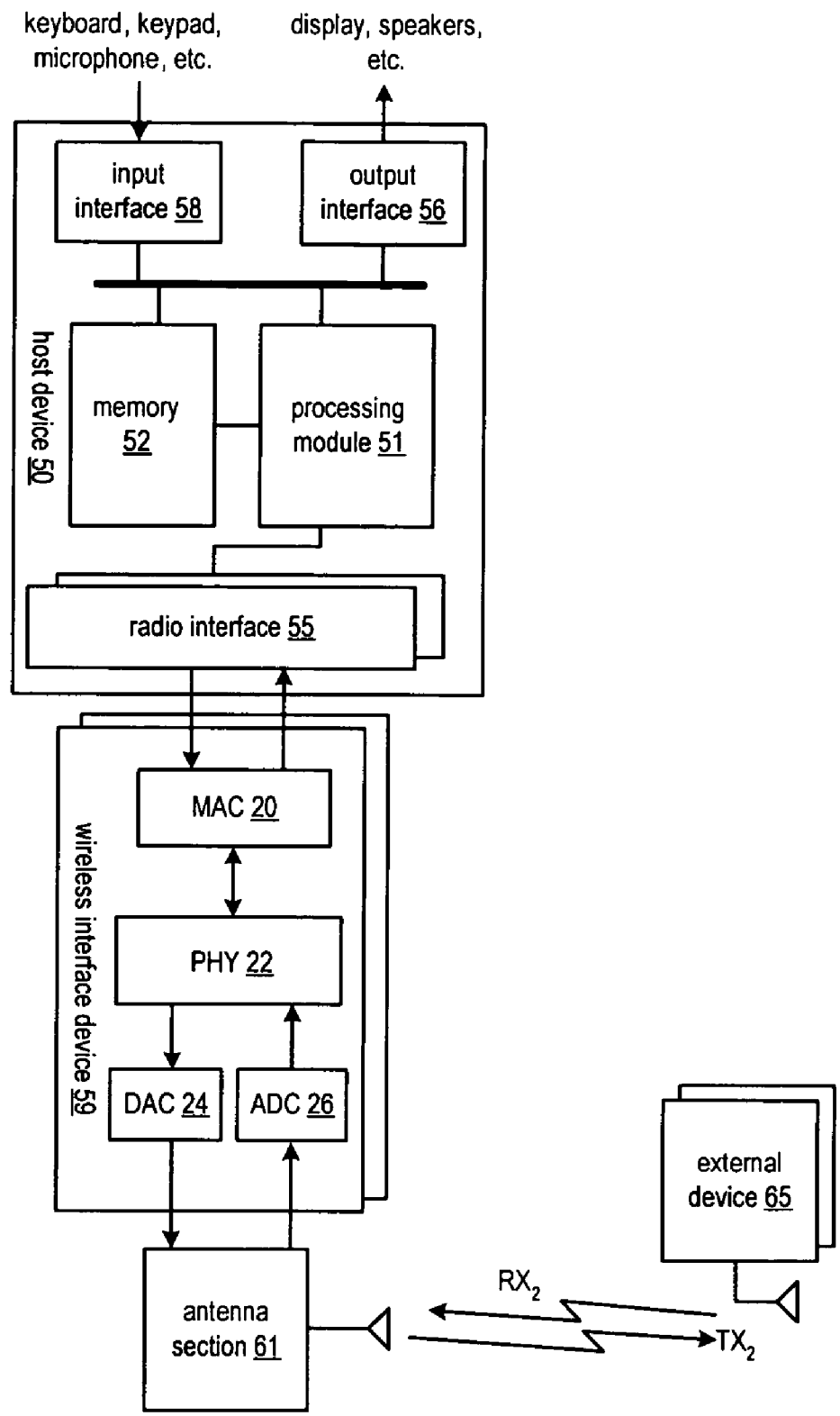
FIG. 2 is a schematic block diagram of a wireless communication device in accordance with the present invention.

FIG. 2 is a schematic block diagram illustrating a wireless communication device that includes the host device (or module) 50 and at least one wireless interface device or radio transceiver 59. The wireless interface device may be built with components of the host device 50 or externally coupled components. As illustrated, the host device 50 includes a processing module 51, memory 52, radio interface 55, input interface 58 and output interface 56. The processing module 51 and memory 52 execute the corresponding instructions that are typically done by the host device. For example, in a cellular telephone device, the processing module 51 performs the corresponding communication functions in accordance with a particular cellular telephone standard.

The wireless interface device 59 includes a media-specific access control protocol (MAC) layer module 20, a physical layer module (PHY) module 22, a digital-to-analog converter (DAC) 24 and an analog-to-digital converter (ADC) 26. Typically, transmit data coming from the host device 50 is presented to the MAC 20, which in turn presents it to the PHY 22. The PHY 22 processes the data (scrambling, encoding, modulation, etc.) and then hands its output to the DAC 24 for conversion to an analog signal. The DAC output is then gained and filtered and passed to the antenna section 61. On the receive side, the antenna section 61 output is gained and filtered, then passed to an ADC 26 for conversion to a digital signal. This digital signal is processed (demapped, decoded, descrambled, etc.) by the PHY 22 and the bits are passed through the MAC to the host 50 for delivery to the output interface 56. The radio interface 55 allows data to be received from and sent to one or more external devices 65 via the wireless interface device 59. Each external device includes its own wireless interface device for communicating with the wireless interface device of the host device. For example, the host device may be personal or laptop computer and the external device 65 may be a headset, personal digital assistant, cellular telephone, printer, fax machine, joystick, keyboard, desktop telephone or access point of a wireless local area network. In this example, external device 65 is an IEEE 802.11 wireless interface device.

For data received from the wireless interface device 59 (e.g., inbound data), the radio interface 55 provides the data to the processing module 51 for further processing and/or routing to the output interface 56. The output interface 56 provides connectivity to an output display device such as a display, monitor, speakers, etc., such that the received data may be displayed. The radio interface 55 also provides data from the processing module 51 to the wireless interface device 59. The processing module 51 may receive the outbound data from an input device such as a keyboard, keypad, microphone, etc., via the input interface 58 or generate the data itself. For data received via the input interface 58, the processing module 51 may perform a corresponding host function on the data and/or route it to a wireless interface device 59 via the radio interface 55.

Figure 3:
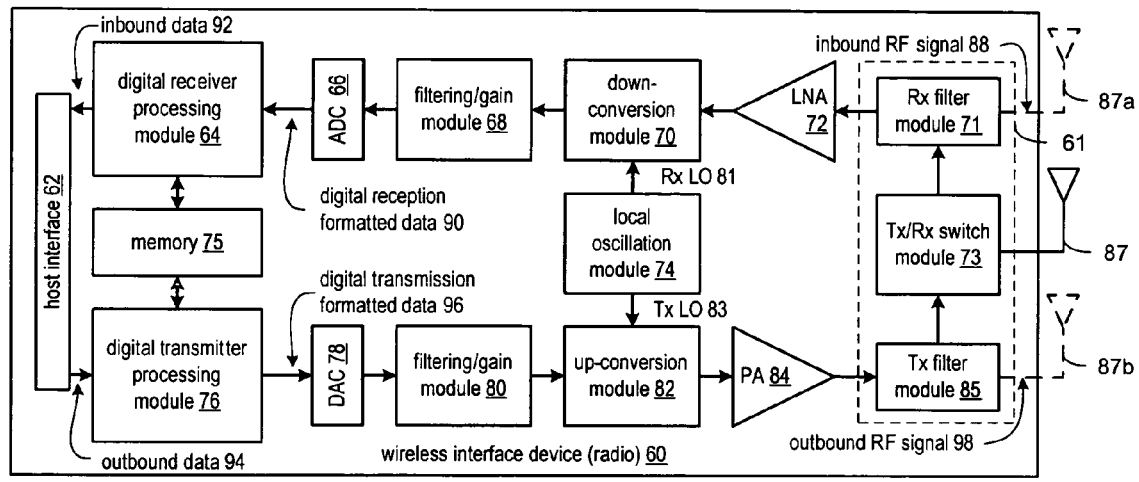
FIG. 3 is a schematic block diagram of a wireless interface device in accordance with the present invention.

FIG. 3 is a schematic block diagram of a wireless interface device (i.e., a radio) 60 which includes a host interface 62, digital receiver processing module 64, an analog-to-digital converter (ADC) 66, a filtering/attenuation module 68, a down-conversion stage 70, a receiver filter 71, a low noise amplifier 72, a transmitter/receiver switch 73, a local oscillation module 74, memory 75, a digital transmitter processing module 76, a digital-to-analog converter (DAC) 78, a filtering/gain module 80, a mixing up-conversion stage 82, a power amplifier 84, and a transmitter filter module 85. The transmitter/receiver switch 73 is coupled to the antenna 87. Still further, the antenna section 61 may include separate, multiple antennas 87a, 87b for the transmit path and the receive path of each wireless interface device. As one of ordinary skill in the art will appreciate, the antenna(s) may be polarized, directional, and be physically separated to provide a minimal amount of interference.

The digital receiver processing module 64, the digital transmitter processing module 76 and the memory 75 may be included in the PHY module and execute digital receiver functions and digital transmitter functions in accordance with a particular wireless communication standard. The digital receiver functions include, but are not limited to, digital frequency conversion, demodulation, constellation demapping, decoding and/or descrambling. The digital transmitter functions include, but are not limited to, scrambling, encoding, constellation mapping, modulation and/or digital baseband to frequency conversion. The digital receiver and transmitter processing modules 64, 76 may be implemented using a shared processing device, individual processing devices, or a plurality of processing devices. Such a processing device may be a microprocessor, microcontroller, digital signal processor, microcomputer, central processing unit, field programmable gate array, programmable logic device, state machine, logic circuitry, analog circuitry, digital circuitry and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64, 76 implements one or more of its functions via a state machine, analog circuitry, digital circuitry and/or logic circuitry, the memory storing the corresponding operational instructions may be embedded with the circuitry comprising the state machine, analog circuitry, digital circuitry and/or logic circuitry.

In operation, the wireless interface device 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11—including all current and future subsections—, Bluetooth, etc.) to produce digital transmission formatted data 96. The digital transmission formatted data 96 will be a digital base-band signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog signal prior to providing it to the mixing stage 82. The mixing stage 82 directly converts the analog baseband or low signal into an RF signal based on a transmitter local oscillation clock 83 provided by local oscillation module 74. The power amplifier 84 amplifies the RF signal to produce outbound RF signal 98, which is filtered by the transmitter filter module 85. The antenna section 61 transmits the outbound RF signal 98 to a targeted device such as a base station, an access point and/or another wireless communication device.

The wireless interface device 60 also receives an inbound RF signal 88 via the antenna section 61, which was transmitted by a base station, an access point, or another wireless communication device. The antenna section 61 provides the inbound RF signal 88 to the receiver filter module 71 via the Tx/Rx switch 73, where the Rx filter 71 bandpass filters the inbound RF signal 88. The Rx filter 71 provides the filtered RF signal to low noise amplifier 72, which amplifies the signal 88 to produce an amplified inbound RF signal. The low noise amplifier 72 provides the amplified inbound RF signal to the down conversion module 70, which directly converts the amplified inbound RF signal into an inbound low IF signal or baseband signal based on a receiver local oscillation clock 81 provided by local oscillation module 74. The down conversion module 70 provides the inbound low IF signal or baseband signal to the filtering/gain module 68. The filtering/gain module 68 filters and/or gains the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by wireless interface device. The host interface 62 provides the recaptured inbound data 92 to the host device (e.g., 50) via the radio interface (e.g., 55).

As will be appreciated, the wireless communication device of FIG. 2 described herein may be implemented using one or more integrated circuits. For example, the host device 50 may be implemented on one integrated circuit, the digital receiver processing module 64, the digital transmitter processing module 76 and memory 75 may be implemented on a second integrated circuit, and the remaining components of the radio 60 and/or antenna section 61, may be implemented on a third integrated circuit. As an alternate example, the radio 60 may be implemented on a single integrated circuit. As yet another example, the processing module 51 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 51 and the digital receiver and transmitter processing module 64 and 76.

In accordance with an exemplary embodiment of the present invention, the branch metrics (M) are derived by adapting metric computation algorithms to reflect specific implementation requirements for a hardware decoder. For example, when a soft decoding approach is used, the input (M) to the Viterbi decoder 14 is a sequence of incremental costs (branch metrics) which can be expressed as a function of the probability of error for a coded bit ($P_e$) with the equation:

$$M = \ln P_e$$

Equation 1: Viterbi Branch Metric as a Function of $P_e$.

As illustrated in FIG. 1, the channel error probability $P_e$ may be determined for a communication channel having a scalar gain, H, followed by additive white Gaussian noise (AWGN) with variance $\sigma^2$. This model accurately describes a wide class of communication channels and may be used in the analysis of specific classes of channels by substituting an appropriate expression for $P_e$. For the AWGN channel, Equation 2:

$$P_e \leq N_e Q\left(C\sqrt{\frac{|H|^2 k_{loc}^2}{\sigma^2}}\right), \quad P_e \text{ for an } AWGN \text{ channel.}$$

where C is a constant that depends on the transmit constellation, $N_e$ is the multiplicity of error events at a signal to noise ratio, and Q(x) is the probability that a zero-mean, unit variance Gaussian variable is larger than x. Equation 2 also incorporates "location information" decoding using the factor $k_{loc}$, which is a scaling of $|H|^2$ that exploits certain bit-labeling and distance properties of higher order constellations. [This scaling factor is described in Broadcom patent application Ser. No. 10/027,824, entitled "Viterbi Decoding with Channel and Location Information" which is incorporated herein by reference in its entirety ("the Lauer Application").] However, the novelty and efficiency of the architecture is maintained even if location information scaling is removed or disabled (by setting $k_{loc}$ to 1). Substituting Equation 2 into Equation 1 yields Equation 3:

$$M = \ln\left[N_e Q\left(C\sqrt{\frac{|H|^2 k_{loc}^2}{\sigma^2}}\right)\right].$$

Viterbi branch metric for an AWGN channel.

In accordance with the present invention, Equation 3 is modified for use in a hardware implementation by approximating the Q function because the integral in the Q function cannot be directly evaluated for an arbitrary input. A useful approximation is Equation 4:

$$\ln P_e \approx a \cdot \frac{|H|^2 k_{loc}^2}{\sigma^2} + b, \quad \text{Approximation of } \ln P_e.$$

where a and b are constants. Also, the branch metrics must be quantized to a finite precision by choosing a quantization range and precision. An expression for the quantization of the metrics over the range $[C_{min}, C_{max}]$ to B bits is given by Equation 5:

$$M = \left\lceil \left(\frac{(2^B - 2)}{C_{max} - C_{min}} \frac{|H|^2 k_{loc}^2}{\sigma^2} - \frac{C_{min}(2^B - 2)}{C_{max} - C_{min}}\right) \right\rceil,$$

Quantized Viterbi branch metrics.

where $\lceil x \rceil$ is the smallest integer no less than x and the result is constrained to the range $[0, 2^B - 1]$.

As described in the Lauer Application, the implementation of Equation 5 may compute $C_{min} \cdot \sigma^2$, $C_{max} \cdot \sigma^2$ and $$\frac{C_{max} - C_{min}}{(2^B - 2)} \sigma^2$$

using high accuracy multiplication operations. The branch metric is found by determining the number of multiples of $$\frac{C_{max} - C_{min}}{(2^B - 2)} \sigma^2$$

in $|H|^2 k_{loc}^2 - C_{min}\sigma^2$. However, such a multiplication-based approach requires significant area and power to implement the large numbers of gates and pipeline stages needed for the high accuracy multiplication operations. For example, with 0.18 μ CMOS technology, a multiplication-based Viterbi branch metric calculation module (such as described in the Lauer Application) uses multiplication operations with 24-bit accuracy, resulting in intermediate data paths of up to 28 bits in width and leading to an overall module size of 0.225 mm².

In accordance with a selected embodiment of the present invention, the circuit area required for branch metric calculations may be reduced by computing the $$\left[\frac{1}{C_1} \frac{|H|^2 k_{loc}^2}{\sigma^2}\right]$$

term directly through multiplication and divisions operations that are performed in the log domain, where, as explained below, $C_1$ is a stored constant that is pre-computed for each possible constellation. Various implementations of the $\log_2(x)$ and $2^x$ functions include using lookup tables to perform interpolation.

In accordance with an exemplary embodiment, an improved implementation for calculating M begins by rewriting Equation 5 as Equation 6:

$$M = \left\lceil \frac{1}{C_1} \frac{|H|^2 k_{loc}^2}{\sigma^2} - C_2 \right\rceil,$$

Simplified expression for Viterbi branch metrics.

Where $$C_1 = \frac{C_{max} - C_{min}}{(2^B - 2)} \text{ and } C_2 = \frac{C_{min}(2^B - 2)}{C_{max} - C_{min}}.$$

Note that for a fixed transmit constellation, $C_1$ and $C_2$ are constants. As a result, $C_1$ and $C_2$ can be pre-computed for each possible constellation and stored in memory. The multiplication and division operations in the first term of the subtraction can be implemented efficiently using logarithms, noting that log(ab)=log(a)+log(b) and log(a/b)=log(a)−log (b), for any logarithm base. This enables the multiplication to be implemented using addition and the division via subtraction, saving both power and area.

Figure 4:
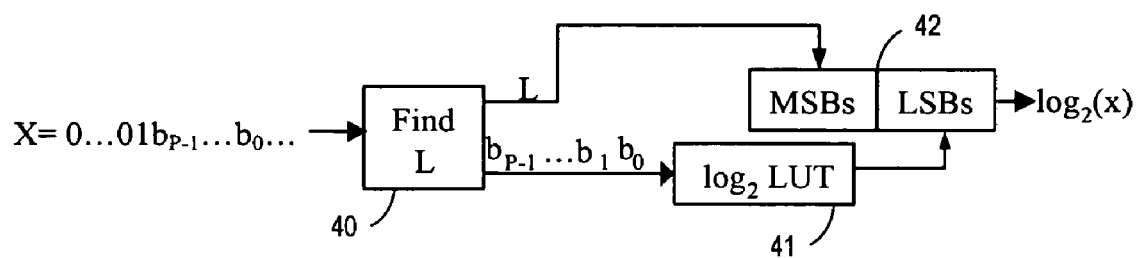
FIG. 4 depicts a block diagram of an efficient $\log_2(x)$ function implementation.

Converting between the linear and log domains depends on efficient log and antilog functions. By choosing a base of 2, efficient log and antilog functions may be efficiently implemented in hardware. A block diagram of an efficient log function implementation is shown in FIG. 4. For a number, x, note that $L \leq \log_2 x < L+1$, where L is the bit position of the most significant "1" in the N-bit binary representation of x. L can be found by "left-shifting" x until a "1" is in the N-1st bit position and subtracting the number of shifts from N-1. An accurate and efficient method for computing $\log_2 x$ is to find L and interpolate between L and L+1 using a lookup table (LUT) indexed by the next P bits of x. After the left-shifting to determine L, these index bits will be in positions N-1 through N-P.

As illustrated in FIG. 4, the $\log_2(x)$ function may be implemented by finding the most significant "1" (MS1) value from the input X (labeled "L" in FIG. 4) and then using a lookup table to refine the value. In particular, the lookup table (LUT) 41 is used to interpolate between consecutive MS1s. In this example, a plurality of bits $(b_{P-1} \ldots b_1 b_0)$ are used to index into LUT 41. The output is an approximation of $\log_2(x)$, where $1 \leq x < 2$ to four fractional bits (in this example). The indexed value is output as the least significant bits (LSB) portion of the output, while the most significant bit (MSB) portion of the output is provided by the most significant "1" value (L). In this way, the $\log_2(x)$ output is generated as a concatenation of the most significant "1" value (L) with the output of LUT 41.

The antilog function may use a similar approach. For a value, y, expressed with R fractional bits, $2^y = 2^A \cdot 2^{B/2^R}$, where $$A = \left\lfloor \frac{y}{2^R} \right\rfloor$$

and $B/2^R = y - A$. The expression $2^A$ is implemented simply as a left shift by A bits. The computation of $2^{B/2^R}$ is implemented using a lookup table indexed by the R least significant bits of y. A block diagram of an example of the antilog function is shown in FIG. 5.

Figure 5:
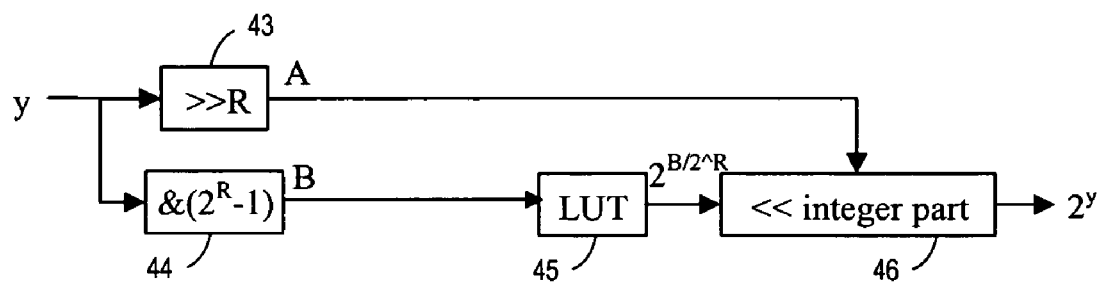
FIG. 5 depicts a block diagram of an efficient antilog function implementation.

FIG. 5 illustrates an exemplary implementation of the $2^y$ function whereby a right shift circuit 43 extracts an integer part (A) from the input (y). In addition, an extraction module 44 generates a fractional part (B) which is used as an index to the lookup table (LUT) 45. In this example, the LUT output represents the value $2^{B/2^R}$. The extracted integer part (A) is used to control the left-shift circuit 46 which shifts the output of LUT 45. The left-shifted value output by shifter 46 represents the $2^y$ output.

In operation, the Viterbi branch metrics may be calculated using the following methodology. First, the term $\log_2 |H|^2$ is computed using a $\log_2(\cdot)$ implementation, such as for example, described above and shown in FIG. 4. Next, the $\log_2 \sigma^2$ term is subtracted. This may be computed using the same logarithm block or passed into the demapper already in the log domain. Next, the $\log_2 C_1$ term, which has been pre-computed and stored in memory, is subtracted. The $\log_2 k_{loc}^2$, term is then added (if location information decoding is used). Next, the antilog of the result is computed using the method described above and illustrated in FIG. 5. After subtracting $C_2$ (which has been stored in memory) from the result, any fractional lists are rounded out and the result is saturated to the range $[0, 2^B - 1]$.

Figure 6:
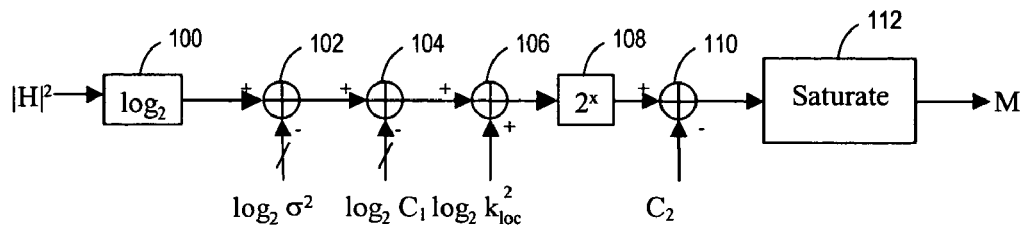
FIG. 6 depicts a block diagram of the branch metric computation.

A block diagram of the branch metric computation described herein is shown in FIG. 6. As illustrated, the input value ($|H|^2$) or some multiple thereof is processed by the $\log_2$ module 100. Continuing now with reference to the terms identified in equation 6, the $(\sigma^2)$ term is divided into the $(|H|^2)$ term by subtracting the log values for these terms at subtractor element 102. The (C1) term is then divided into the quotient by subtracting its log using subtractor module 104. The $(k_{loc}^2)$ term is then multiplied with the quotient by adding its log with adder module 106. The antilog module 108 then processes this product so that the (C2) term may be subtracted with subtraction module 110. As explained herein, the (C2) term is a function of the constellation size, and is included in order to use truncation instead of rounding techniques. Saturation module 1112 saturates the final product (for example, to 4 bits) to thereby generate the branch metric value (M).

The methodology of the present invention requires very little area in hardware. For example, in one implementation, it uses only 0.0225 mm² of area when constructed using 0.18 μ CMOS technology, giving a factor of 10 reduction in area as compared to other approaches. The improved implementation has greatly reduced the number of gates and pipeline required for this function, thereby reducing the power requirements. Also, the log domain calculations are performed on 9-bit values and use intermediate data paths no larger than 10 bits wide. Computation in the logarithmic domain is well suited to this application because, while the dynamic range of the inputs can be quite large (e.g., a dynamic range of 32 bits on the input $|H|^2$), the absolute accuracy that needs to be maintained is quite small (e.g., 4-bits) and can be implemented using only 9 bits of dynamic range and 4 bits of accuracy in the log domain.

Figure 7:
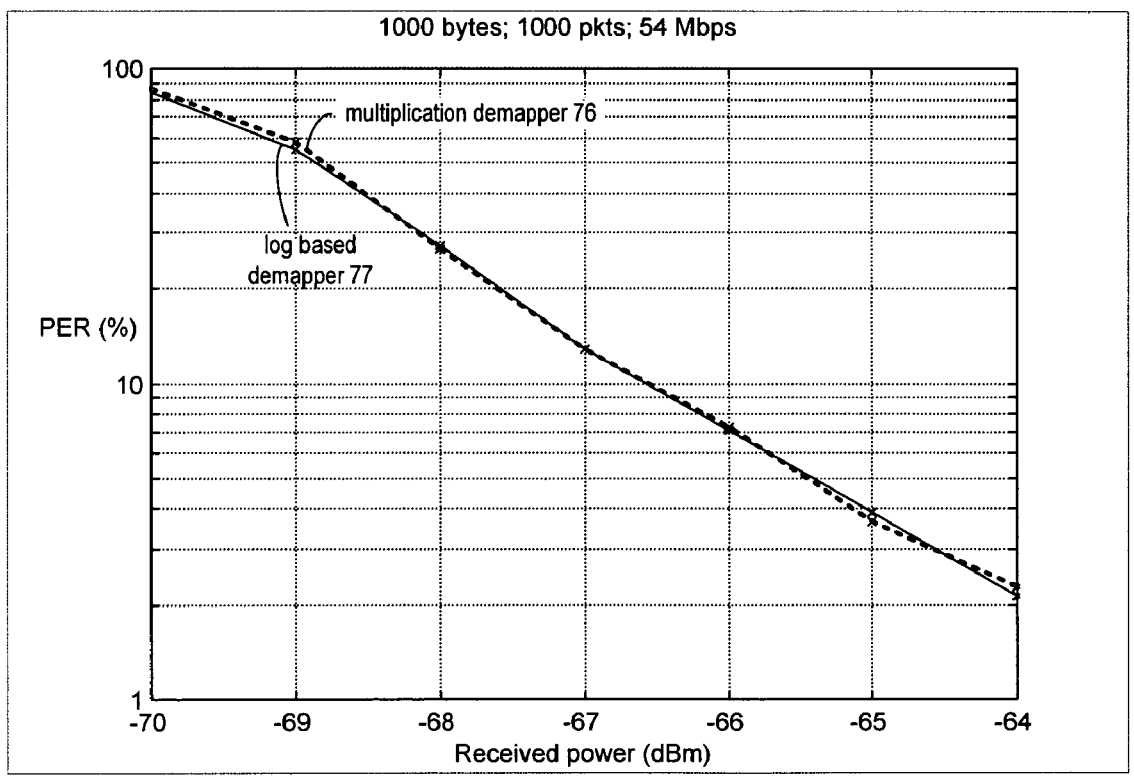
FIG. 7 is a graphical comparison of packet error rate (PER) performance using different Viterbi branch metric implementations.

A comparison of decoder performance of a selected embodiment of the present invention is provided in FIG. 7, which depicts a graphical comparison of the decoder performance in terms of packet error rate (PER) versus received power. Line 76 represents the performance of a decoder using a multiplication-based demapping approach, while line 77 represents the performance of a decoder using the log-based demapping approach described herein. Despite the significant decrease in area and power requirements, the new implementation does not diminish performance.

As described herein and claimed below, a method and apparatus are provided for calculating quantized soft decision Viterbi branch metrics that requires very little computational complexity. This translates to a very area and power efficient implementation in a semiconductor. The new method consists of two parts. First, the expression for the branch metric is cast into a form that lends itself to an efficient hardware implementation. The second part is the implementation itself, which exploits easy to implement log and antilog functions in order to avoid computationally complex multiplication and division operations. In one implementation, the demapper requires less area and less power than previous implementations.

As will be appreciated, the present invention may be implemented in a computer accessible medium including one or more data structures representative of the circuitry included in the system described herein. Generally speaking, a computer accessible medium may include storage media such as magnetic or optical media, e.g., disk, CD-ROM, or DVD-ROM, volatile or non-volatile memory media such as RAM (e.g., SDRAM, RDRAM, SRAM, etc.), ROM, PROM, EPROM, EEPROM, etc., For example, data structure(s) of the circuitry on the computer accessible medium may be read by a program and used, directly or indirectly, to implement the hardware comprising the circuitry described herein. For example, the data structure(s) may include one or more behavioral-level descriptions or register-transfer level (RTL) descriptions of the hardware functionality in a high level design language (H DL) such as Verilog or VHDL. The description(s) may be read by a synthesis tool which may synthesize the description to produce one or more netlist(s) comprising lists of gates from a synthesis library. The netlist(s) comprise a set of gates which also represent the functionality of the hardware comprising the circuitry. The netlist(s) may then be placed and routed to produce one or more data set(s) describing geometric shapes to be applied to masks. The masks may then be used in various semiconductor fabrication steps to produce a semiconductor circuit or circuits corresponding to the circuitry. Alternatively, the data structure(s) on computer accessible medium may be the netlist(s) (with or without the synthesis library) or the data set(s), as desired. In yet another alternative, the data structures may comprise the output of a schematic program, or netlist(s) or data set(s) derived therefrom. While a computer accessible medium may include a representation of the present invention, other embodiments may include a representation of any portion of the decoding and demapping system and circuitry (e.g., log2x, module, antilog module, adders, subtractors, etc.).

While the system and method of the present invention has been described in connection with the preferred embodiment, it is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

What is claimed is:

1. In an integrated circuit wireless communication device, a method for Viterbi decoding comprising:

receiving a transmitted signal over a channel substantially characterized by a scalar gain value and a noise value;

processing the gain value and noise value to determine a branch metric by determining a log of the scalar gain value and subtracting therefrom a log of the noise value and subtracting therefrom the log of a first constant to form a first sum, and determining an antilog of the first sum and subtracting therefrom a second constant to form a second sum, the second sum corresponding to the branch metric; and providing the branch metric to a Viterbi decoder.

2. The method of claim 1, wherein the processing of the gain value and noise value to determine a branch metric scaling further comprises adding a log of a location information scaling factor to the first sum.

3. The method of claim 1, wherein the processing of the gain value and noise value to determine a branch metric further comprises rounding out any fractional bits in the second sum.

4. The method of claim 1, wherein the processing of the gain value and noise value to determine a branch metric further comprises saturating the second sum.

5. The method of claim 1, wherein the processing of the gain value and noise value to determine a branch metric further comprises using a processor to calculate a branch metric (M) using the equation, $$M = \left[\frac{1}{C_1} \frac{|H|^2 k_{loc}^2}{\sigma^2} - C_2\right],$$

where H is the scalar Rain value, $C_1$ is the first constant for a transmit constellation, $C_2$ is the second constant for the transmit constellation, $k_{loc}$ is a location information scaling factor and $\sigma^2$ is the noise value.

6. The method of claim 1, wherein the log of the scalar gain value is determined by:

determining a lower integer boundary L for the scalar gain value which is a bit position of a most significant "1" in a binary representation of the scalar gain value;

interpolating an interpolated value between L and L+1 using a lookup table indexed by P next most significant bits of the scalar gain value; and concatenating the lower integer boundary L and the interpolated value to form the log of the scalar gain value.

7. The method of claim 6, wherein the determination of a lower integer boundary L comprises left shifting the scalar gain value a required number of shifts until an N-1 bit position contains a one value, and then subtracting the required number of shifts from the N-1 value.

8. The method of claim 1, wherein the log of the noise value is determined by:

determining a first value which is a bit position of the most significant "1" in an N-bit binary representation of the noise value;

determining a second value by interpolating between the first value and the first value plus one using a lookup table; and concatenating the first value and the second value as a most significant bits portion and least significant bits portion, respectively, to form the log of the noise value.

9. The method of claim 1, wherein the antilog of the first sum is determined by:

right shifting the first sum by R bits to generate a left shift control signal; and using the R least significant bits of the first sum as an index into a lookup table to generate an intermediate value which is left shifted under control of the left shift control signal to generate the antilog of the first sum.

10. The method of claim 1, wherein the processing of the gain value and noise value are performed by a PHY module in a wireless interface device.

11. An article of manufacture having at least one recordable medium having stored thereon executable instructions and data which, when executed by at least one processing device, cause the at least one processing device to compute a branch metric for a Viterbi decoder, comprising implementing a multiplication operation of a first term and a second term in the branch metric computation by:

adding a log of the first term to a log of the second term to form a first sum; and determining the antilog of the first sum, wherein the processing device computes a branch metric for a Viterbi decoder by computing a $\log_2 |H|^2$ value, where H represents a scalar gain value for a transmission channel;

subtracting a $\log_2 \sigma^2$ value from the $\log_2 |H|^2$ value to form a first sum, where $\sigma^2$ represents a noise variance value for the transmission channel;

subtracting a $\log_2 C_1$ value from the first sum to form a second sum, where the $C_1$ value has been pre-computed and stored in memory;

computing an antilog of the second sum; and subtracting a $C_2$ value which has been stored in memory from the antilog of the second sum to form the branch metric.

12. The article of manufacture of claim 11, wherein processing device rounds out any fractional bits in the branch metric and saturates the branch metric to a predetermined range.

13. An apparatus for decoding a signal, the apparatus comprising:

means for receiving a sampled signal;

means for demapping the received sampled signal into a branch metric comprising means for performing multiplication operations in a log domain using an adder circuit and means for performing division operations in a log domain using an subtractor circuit; and means for providing the branch metric a Viterbi decoder, where the means for demapping comprises a means for calculating a branch metric (M) using 1 the equation $$M = \left[\frac{1|H|^2 k_{loc}^2}{C_1 \sigma^2} - C_2\right]$$

where H represents a scalar gain value for a transmission channel, $C_1$ is a first pre-computed constant for a transmit constellation, $C_2$ is a second pre-computed constant for the transmit constellation, $k_{loc}$ is a location information scaling factor, and $\sigma^2$ represents a noise variance value for the transmission channel.

14. An apparatus for decoding a signal, the apparatus comprising:

means for receiving a sampled signal;

means for demapping the received sampled signal into a branch metric comprising means for performing multiplication operations in a log domain using an adder circuit and means for performing division operations in a log domain using an subtractor circuit; and means for providing the branch metric a Viterbi decoder, where the means for demapping comprises a means for calculating a branch metric (M) using 1 the equation $$M = \left[\frac{1|H|^2}{C_1 \sigma^2} - C_2\right]$$

where H represents a scalar gain value for a transmission channel, $C_1$ is a first pre-computed constant for a transmit constellation, $C_2$ is a second pre-computed constant for the transmit constellation, $k_{loc}$ is a location information scaling factor, and $\sigma^2$ represents a noise variance value for the transmission channel.

15. The apparatus of claim 13, where the means for demapping comprises an input for accepting a first value representing the scalar gain for a transmission channel;

a log unit that accepts the first value from the input and determines a log of the first value;

a first subtractor for subtracting a log of a second value from the log of the first value to form a first difference, said second value representing a measure of additive white Gaussian noise for a channel over which the sampled signal was transmitted;

a second subtractor for subtracting a log of a first constant from the first difference to form a second difference;

a first adder for adding a log of a location information scaling factor ($k_{loc}$) to the second difference to form a first sum;

an antilog unit that accepts the first sum and determines an antilog of the first sum;

a second adder for adding the antilog of the first sum to a second constant to a preliminary branch metric, where the second constant comprises an offset that is a function of a transmit constellation for the transmit channel; and a saturation unit for saturating the preliminary branch metric to generate the branch metric.

16. The apparatus of claim 15, wherein the first subtractor and second subtractor are implemented as a single circuit.

* * * * *